(12) United States Patent
Hong

(10) Patent No.: US 9,818,461 B1
(45) Date of Patent: Nov. 14, 2017

(54) SEMICONDUCTOR MEMORY DEVICE AND OPERATING METHOD THEREOF

(71) Applicant: SK hynix Inc., Gyeonggi-do (KR)

(72) Inventor: Yun-Gi Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/371,388

(22) Filed: Dec. 7, 2016

(30) Foreign Application Priority Data

Jun. 28, 2016 (KR) ........................ 10-2016-0080559

(51) Int. Cl.
*G11C 7/22* (2006.01)
*G11C 7/10* (2006.01)
*G06F 3/06* (2006.01)

(52) U.S. Cl.
CPC .............. *G11C 7/22* (2013.01); *G06F 3/0625* (2013.01); *G06F 3/0647* (2013.01); *G06F 3/0656* (2013.01); *G06F 3/0688* (2013.01); *G11C 7/10* (2013.01)

(58) Field of Classification Search
CPC ........ G11C 7/1078; G11C 7/22; G11C 7/1006
USPC ...................................... 365/189.16
See application file for complete search history.

(56) References Cited

U.S. PATENT DOCUMENTS

2007/0008784 A1*  1/2007  Faue ................... G11C 7/1072
                                                365/189.16

FOREIGN PATENT DOCUMENTS

KR          100670709          1/2007

\* cited by examiner

*Primary Examiner* — Jason Lappas
(74) *Attorney, Agent, or Firm* — IP & T Group LLP

(57) ABSTRACT

A semiconductor memory device includes a memory cell array; a memory cell array; a data receiver suitable for receiving a plurality of data sequentially inputted from an exterior, the plurality of data including previous data and current data; a data driving controller suitable for detecting the number of toggling values of the current data in comparison with the previous data and generating first to fourth driving control signals based on the number of toggling values; and a driver suitable for receiving input data through the data receiver and driving the input data or inverted input data to data transfer lines in response to the first to fourth driving control signals.

19 Claims, 3 Drawing Sheets

SEMICONDUCTOR MEMORY DEVICE AND OPERATING METHOD THEREOF

CROSS-REFERENCE TO RELATED APPLICATIONS

The present application claims priority of Korean Patent Application No. 10-2016-0080559, filed on Jun. 28, 2016, which is incorporated herein by reference in its entirety.

BACKGROUND

1. Field

Exemplary embodiments of the present invention relate to semiconductor design technology, and more particularly, to a semiconductor memory device capable of controlling a data write operation.

2. Description of the Related Art

Semiconductor memory devices generally perform operations of storing and outputting data. A semiconductor memory device may receive data to be programmed into the semiconductor memory device and output the data stored in the semiconductor memory device through a data pad. The semiconductor memory device may transfer data that are received through the data pad to a memory bank region during a write operation, and may output data that are transferred from the memory bank region through the data pad during a read operation.

The increase in the operation speed and data bandwidth of semiconductor memory devices raise the number of data and the number of lines between the data pad and the memory bank region. Also, the number of control signals for processing the data is increased as well.

During a write operation of a semiconductor memory device, the data transferred through a data pad may be aligned, and the aligned data may be transferred to a memory bank through a data transfer line. When the data are transferred to the memory bank through the data transfer line, a toggle operation of the data transfer line may be performed as the data loaded on the data transfer line are collectively replaced by the new write data, regardless of the logic value of the data on the data transfer line. Therefore, since all the values of the data are toggled collectively and are replaced by the new write data, current consumption in the data transfer line may be wastefully increased, which is problematic.

SUMMARY

Embodiments of the present invention are directed to a semiconductor memory device using less current during a data write operation.

In accordance with an embodiment of the present invention, a semiconductor memory device includes: a memory cell array; a data receiver suitable for receiving a plurality of data sequentially inputted from an exterior, the plurality of data including previous data and current data; a data driving controller suitable for detecting the number of toggling values of the current data in comparison with the previous data and generating first to fourth driving control signals based on the number of toggling values; and a driver suitable for receiving input data through the data receiver and driving the input data or inverted input data to data transfer lines in response to the first to fourth driving control signals.

The data driving controller may include: a first comparison unit suitable for generating a comparison signal by comparing the previous data with the current data; a second comparison unit suitable for generating a selection control signal by comparing the comparison signal with a reference comparison signal; a first selection unit suitable for selectively outputting the first driving control signal or the second driving control signal in response to the selection control signal and a second selection unit suitable for selectively outputting the third driving control signal or the fourth driving control signal in response to the selection control signal.

The data receiver may include: a data buffer suitable for receiving external data in response to a reference voltage; and an internal strobe signal generator suitable for generating an internal data strobe signal by performing a frequency division on a data strobe signal.

The data receiver may further include: a data aligner suitable for aligning internal data inputted through the data buffer in response to the internal data strobe signal and for generating the aligned data as the input data.

The data driving controller may generate the first to fourth driving control signals, which are inverted data and non-inverted data of the input data, based on the number of values of the aligned data outputted from the data aligner that toggle.

The driver may include: a first driving unit suitable for driving the aligned data to a first data transfer line among the data transfer lines in response to the first driving control signal or the second driving control signal; and a second driving unit suitable for driving the aligned data loaded on the first data transfer line to a second data transfer line among the data transfer lines in response to the third driving control signal or the fourth driving control signal.

The first driving unit may include: a first data input/output driving unit suitable for driving the aligned data to the first data transfer line in response to the first driving control signal; and a second data input/output driving unit suitable for driving the aligned data to the first data transfer line in response to the second driving control signal, and wherein the first data input/output driving unit and the second data input/output driving unit are driven selectively, and output values of the first data input/output driving unit and the second data input/output driving unit are differential output values.

The second driving unit may include: a first write driving unit suitable for driving the data loaded on the first data transfer line to the second data transfer line in response to the third driving control signal; and a second write driving unit suitable for driving the data loaded on the first data transfer line to the second data transfer line in response to the fourth driving control signal, and wherein the first write driving unit and the second write driving unit are driven selectively, and output values of the first write driving unit and the second write driving unit are differential output values.

The previous data may include the data loaded on the first data transfer line during a first write operation.

The current data may include the input data that are inputted during a second write operation which is performed after the first write operation.

The first data transfer line may include a global input/output line, and the second data transfer line includes a local input/output line.

In accordance with another embodiment of the present invention, a method for operating a semiconductor memory device includes: sequentially receiving a plurality of data through a data pad; detecting the number of toggling values of current data by comparing the current data with previous data; generating a plurality of driving control signals based on the detected number of the toggling values of the current data converting the detected number of the toggling values of the current data into a toggling voltage; driving input data to data transfer lines, when the toggling voltage is lower than a reference voltage; and inverting the input data and driving the inverted data to the data transfer lines, when the toggling voltage is higher than the reference voltages.

The generating of the plurality of the driving control signals may include: generating first and third driving control signals among the plurality of the driving control signals, when the toggling voltage is lower than the reference voltage; and generating second and fourth driving control signals among the plurality of the driving control signals, when the toggling voltage is higher than the reference voltage.

The method may further include: generating an internal data strobe signal by performing a frequency division on a data strobe signal; and generating aligned data that are obtained by aligning the received plurality of data as the input data in response to the internal data strobe signal.

The generating of the plurality of the driving control signals may include: generating the plurality of the driving control signals, which are inverted data and non-inverted data of the plurality of the data, based on the number of toggling values of the aligned data.

The driving of the input data to the data transfer lines may include: driving the aligned data to a first data transfer line among the data transfer lines in response to the first driving control signal; and driving the aligned data loaded on the first data transfer line to a second data transfer line among the data transfer lines.

The inverting of the input data and driving the inverted data to the data transfer lines may include: inverting the aligned data so and driving the inverted aligned data to the first data transfer line in response to the second driving control signal; and inverting the inverted aligned data loaded on the first data transfer line and driving resultant data to the second data transfer line.

The previous data may include data that are loaded on the first. data transfer line during a first write operation.

The current data may include the input data that are inputted during a second write operation which is performed after the first write operation.

In accordance with yet another embodiment of the present invention, a method for operating a semiconductor memory device includes: receiving and driving first data to data transfer lines during a first write operation; receiving and aligning second data during a second write operation which is performed after the first write operation; detecting the number of toggling values of the second data by comparing the second data with the first data and generating a plurality of driving control signals for controlling driving of the data transfer lines; converting the detected number of the toggling values of the second data into a toggling voltage; driving the second data to the data transfer lines, when the toggling voltage is lower than a reference voltage; and inverting the second data and driving the inverted data to the data transfer lines, when the toggling voltage is higher than the reference voltage.

BRIEF DESCRIPTION OF THE DRAWINGS

The present invention will now be described in reference with the following drawings wherein.

DETAILED DESCRIPTION

Figure 1:
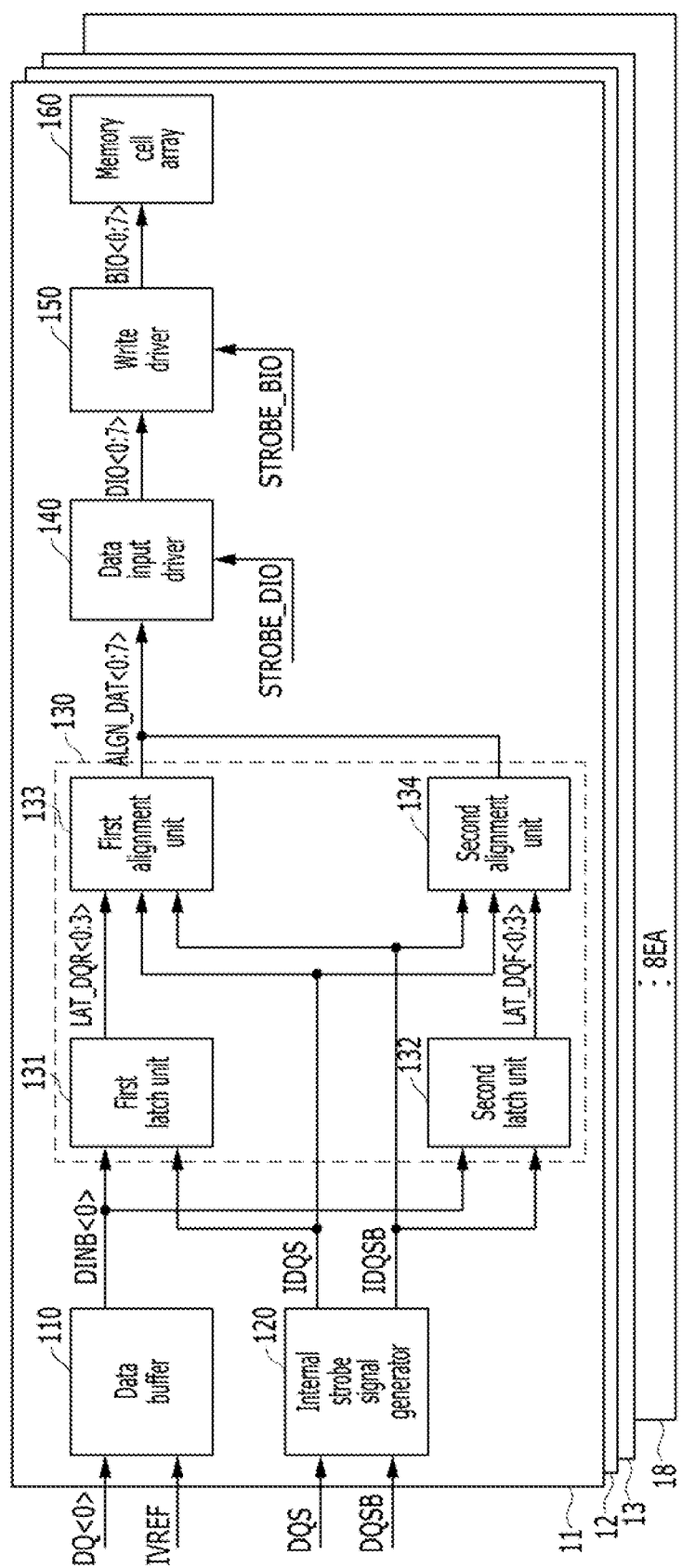
FIG. 1 is a block diagram illustrating semiconductor memory device performing a typical write operation.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art to which the present invention pertains.

Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present inventions.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and Intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or al of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a semiconductor memory device performing a typical write operation.

Referring to FIG. 1, the semiconductor memory device may include a plurality of memory blocks 11, 12, 13, . . . , and 18. Each of the memory blocks 11, 12, 13, . . . , and 18 may include a data buffer 110, an internal strobe signal generator 120, a data aligner 130, a data input driver 140, a write driver 150, and a memory cell array 160.

The data buffer 110, the internal strobe signal generator 120, the data aligner 130, and the data input driver 140 may belong to a peripheral region, which is a peripheral circuit. The write driver 150 and the memory cell array 160 may belong to a bank region.

Since all the memory blocks 11, 12, 13, . . . , and 18 have the same structure and perform the same operations, only the first memory block 11 is representatively described herein.

The data buffer 110 may generate an input data DINB<0> by comparing a data DQ<0> that is inputted from a data pad (not shown) with a reference voltage IVREF.

The internet strobe signal generator 120 may generate an internal strobe signal IDQS and an internal strobe bar signal IDQSB by receiving a data strobe signal DQS and a data strobe bar signal DQSB and performing a frequency division for the received signals.

The data aligner 130 may generate first to eighth aligned data ALGN_DAT<0:7> by latching the input data DINB<0> that is consecutively inputted in synchronization with the internal strobe signal IDQS and the internal strobe bar signal IDQSB so as to generate first and second latch data LAT_DQR<0:3> and LAT_DQF<0:3> and aligning the first and second latch data LAT_DQR<0:3> and LAT_DQF<0: 3>.

The data aligner 130 may include a first latch unit 131, a second latch unit 132, a first alignment unit 133, and a second alignment unit 134.

The first latch unit 131 may latch the input data DINB<0> that is consecutively inputted in synchronization with the internal strobe signal IDQS and output the first latch data LAT_DQR<0:3>.

The second latch unit 132 may latch the input data DINB<0> that is consecutively inputted in synchronization with the internal strobe bar signal IDQSB and output the second latch data LAT_DQF<0:3>.

The first alignment unit 133 may align the first latch data LAT_DQR<0:3> in response to the internal strobe signal IDQS and the internal strobe bar signal IDQSB. The second alignment unit 134 may align the second latch data LAT_DQF<0:3> in response to the internal strobe signal IDQS and the internal strobe bar signal IDQSB. The first and second latch data LAT_DQR<0:3> and LAT_DQF0:3> that are aligned through the first alignment unit 133 and the second alignment unit 134 may be outputted as aligned data ALGN_DAT<0:7>.

The data input driver 140 may drive the aligned data ALGN_DAT<0:7> in response to a data input/output strobe signal STROBE_DIO, and output the aligned data ALGN_DAT<0:7> into data input/output lines DIO<0:7>.

The write driver 150 may drive data loaded on the data input/output lines DIO<0:7> in response to a bank input/output strobe signal STROBE_BIO and output the data into bank input/output lines BIO<0:7>.

The data loaded on the bank input/output lines BIO<0:7> may be transferred to the memory cell array 160.

Hereafter, an operation of the semiconductor memory device described.

When the semiconductor memory device performs a write operation, the memory blocks 11, 12, 13, . . . , and 18 may serially receive data (e.g. eight data B<0:7>) through eight data pads DQ<0:7>. Therefore, since the semiconductor memory device receives eight data B<0:7> through each of the eight data pads DQ<0:7>, the number of the data that the semiconductor memory device receives comes to 64 (64=8× 8).

The data aligner 130 may align input data DINB<0:7> that are serially inputted based on internal strobe signals IDQS and IDQSB, which are generated by performing a frequency division on a data strobe signal DQS, into parallel data and generate aligned data ALGN_DAT<0:63>.

The aligned data ALGN_DAT<0:63> that are aligned in parallel to each other may be driven to data input/output lines DIO<0:63> by the data input driver 140. The data loaded on the data input/output lines DIO<0:63> may be driven to the bank input/output lines BIO<0:63> by the write driver 150. The data loaded on the bank input/output lines BIO<0:63> may be transferred to the memory cell array 160. Herein, the data input/output lines DIO<0:63> have much load and great driving power consumption.

Meanwhile, when a semiconductor memory device having the above-described structure consecutively performs a write operation and data are transferred to the bank region through the data transfer lines, toggling may occur in the data transfer lines as all the data currently existing on the data transfer lines are collectively replaced by the new write data regardless of the logic values of the existing data on the data transfer lines. The data transfer lines may, for example, include the data input/output lines DIO<0:63> and the bank input/output lines BIO<0:63>.

To be more specific, a semiconductor memory device may consecutively perform a first write operation and a second write operation. During the first write operation, first data may be loaded on the data transfer lines and during the second write operation, second data that are new data obtained by toggling the first data, which are loaded on the data transfer lines ahead of the second data, may be loaded on the data transfer lines. For example, if, as an example, all the data loaded on the data transfer lines have a value of '0' during the first write operation and all the new write data loaded on the data transfer lines during the second write operation have a value of '1' all the new write data loaded on the data transfer lines during the second write operation have to go through a toggling operation, consuming current.

Figure 2:
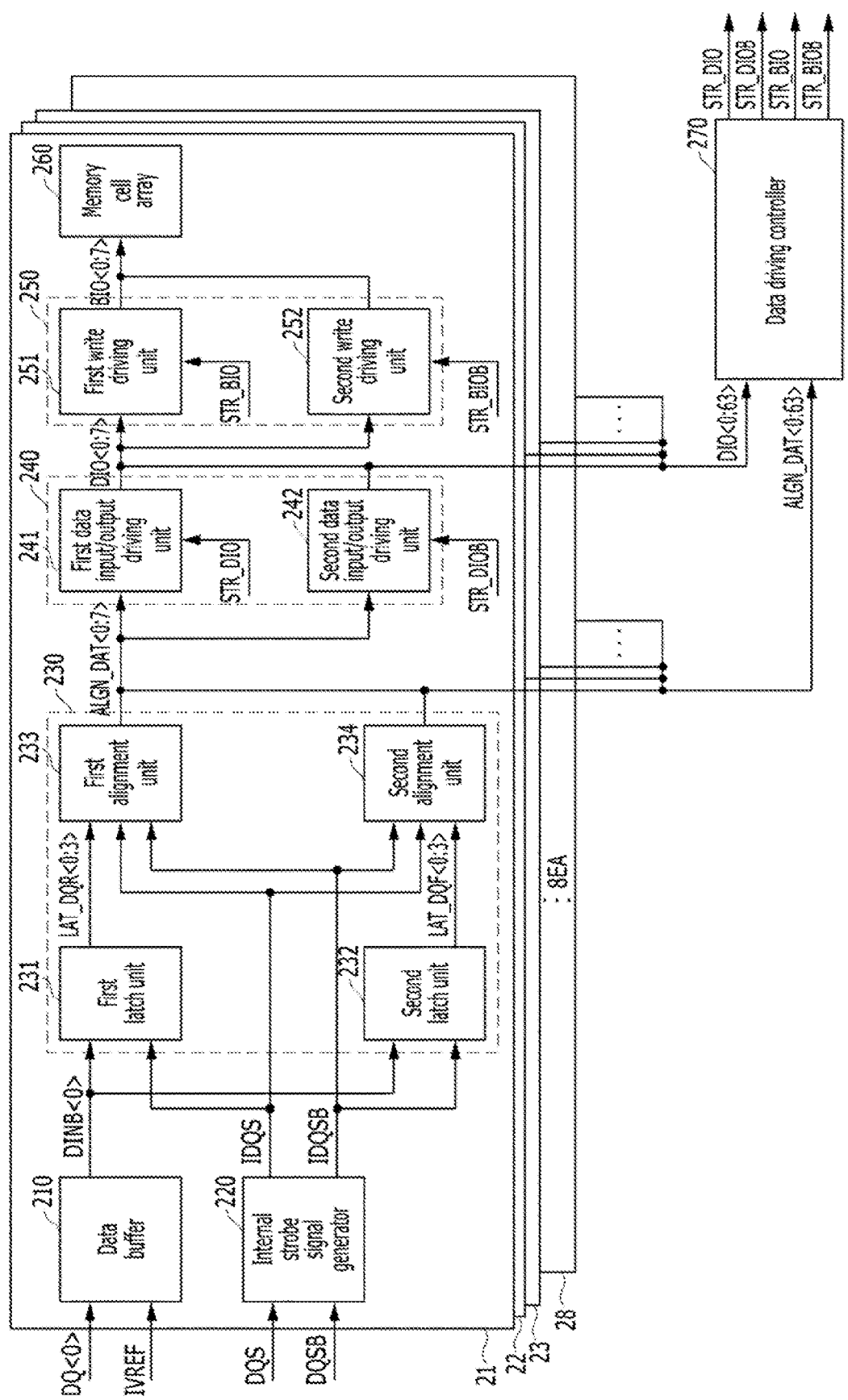
FIG. 2 is a block diagram illustrating a semiconductor memory device performing a write operation, in accordance with an embodiment of the present invention.

FIG. 2 is a block diagram illustrating a semiconductor memory device performing a write operation in accordance with an embodiment of the present invention.

Referring to FIG. 2, the semiconductor memory device may include a plurality of memory blocks 21, 22, 23, . . . , and 28. Each of the memory blocks 21, 22, 23, . . . , and 28 may include a data buffer 210, an internal strobe signal generator 220, a data aligner 230, a first driver 240, a second driver 250, a memory cell array 260 and a data driving controller 270.

The data buffer 210, the internal, strobe signal generator 220, the data aligner 230, the first driver 240 and the data driving controller 270 may belong to a peripheral region, which is a peripheral circuit. The second driver 250 and the memory cell array 260 may belong to a bank region.

Since a the memory blocks 21, 22, 23, . . . , and 28 have the same structure and perform the same operations, only a first memory block 21 is representatively described herein.

The data buffer 210 may generate an input data DINB<0> by comparing a data DQ<0> that is inputted from a data pad with a reference voltage IVREF. Herein, the reference voltage IVREF may be set at a suitable voltage level for deciding the logic level of the data DQ<0>.

The internal strobe signal generator 220 may generate an internal strobe signal IDQS and an internal strobe bar signal IDQSB by receiving a data strobe signal DQS and a data strobe bar signal DQSB and performing a frequency division for the received signals. Herein, the data strobe signal DQS and the data strobe bar signal DQSB may be transferred from an external device, e.g., a memory controller. Also, the internal strobe signal IDQS and internal strobe bar signal IDQSB are signals obtained by performing the frequency division for the received data strobe signal DQS and data strobe bar signal DQSB. The internal strobe signal IDQS and the internal strobe bar signal IDQSB may be of opposite phases.

The data aligner 230 may generate first to eighth aligned data ALGN_DAT<0:7> by latching the input data DINB<0> that is consecutively inputted in synchronization with the internal strobe signal IDQS and the internal strobe bar signal IDQSB so as to generate first and second latch data LAT_DQR<0:3> and LAT_DQF<0:3> and aligning the first and second latch data LAT_DQR<0:3> and LAT_DQF<0:3>.

The data buffer 210, the internal strobe signal generator 220 and the data aligner 230 may operate as a data receiver for receiving a plurality of data sequentially inputted from an exterior device.

The data aligner 230 may include a first latch unit 231, a second latch unit 232, a first alignment unit 233, and a second alignment unit 234.

The first latch unit 231 may latch the input data DINB<0> that is consecutively inputted in synchronization with the internal strobe signal IDQS and output the first latch data LAT_DQR<0:3>. The first latch unit 231 may include a D flip-flop.

The second latch unit 232 may latch the input data DINB<0> that is consecutively inputted in synchronization with the internal strobe bar signal IDQSB and output the second latch data LAT_DQF<0:3>. The second latch unit 232 may also include a D flip-flop.

The first alignment unit 233 may align the first latch data LAT_DQR<0:3> in response to the internal strobe signal IDQS and the internal strobe bar signal IDQSB. The second alignment unit 234 may align the second latch data LAT_DQF<0:3> in response to the internal strobe signal IDQS and the internal strobe bar signal IDQSB. The first and second latch data LAT_DQR<0:3> and LAT_DQF<0:3> that are aligned through the first alignment unit 233 and the second alignment unit 234 may be outputted as aligned data ALGN_DAT<0:7>. Herein, the first latch data LAT_DQR<0:3> and the second latch data LAT_DQF<0:3> may be data that are serially inputted, and the aligned data ALGN_DAT<0:7> obtained through the first alignment unit 233 and the second alignment unit 234 may be parallel data. In short, the first alignment unit 233 and the second alignment unit 234 may be a de-serializer.

The first driver 240 may drive the aligned data ALGN_DAT<0:7> in response to a first data input/output strobe signal STR_DIO and a second data input/output strobe signal STR_DIOB, and output the aligned data ALGN_DAT<0:7> into data input/output lines DIO<0:7>.

The first driver 240 may include a first data input/output driving unit 241 and a second data input/output driving unit 242. The first data input/output driving unit 241 may include a buffer circuit, and the second data input/output driving unit 242 may include an inverter circuit.

The first data input/output driving unit 241 may drive the aligned data ALGN_DAT<0:7> in response to the first data input/output strobe signal STR_DIO and output the aligned data ALGN_DAT<0:7> into the data input/output lines DIO<0:7>. The second data input/output driving unit 242 may drive the aligned data ALGN_DAT<0:7> in response to the second data input/output strobe signal STR_DIOB and output the aligned data ALGN_DAT<0:7> into the data input/output lines DIO<0:7>.

Herein, the first data input/output strobe signal STR_DIO and the second data input/output strobe signal STR_DIOB may be of the opposite phases to each other, and they may be generated in the data driving controller 270, which is to be described later on. Also, the data input/output lines DIO<0:7> may include global input/output lines GIO.

The second driver 250 may drive data loaded on the data input/output lines DIO<0:7> in response to a first bank input/output strobe signal STR_BIO and a second bank input/output strobe signal STR_BIOB and output the data loaded on the data input/output lines DIO<0:7> into bank input/output lines BIO<0:7>.

The second driver 250 may include a first write driving unit 251 and a second write driving unit 252. The first write driving unit 251 may include a buffer circuit, and the second write driving unit 252 may include an inverter circuit.

The first write driving unit 251 may drive the data loaded on the data input/output lines DIO<0:7> in response to the first bank input/output strobe signal STR_BIO and output the data into the bank input/output lines BIO<0:7>. The second write driving unit 252 may drive the data loaded on the data input/output lines DIO<0:7> in response to the second bank input/output strobe signal STR_BIOB and output the data into the bank input/output lines BIO<0:7>.

Herein, the first bank input/output strobe signal STR_BIO and the second bank input/output strobe signal STR_BIOB may be of the opposite phases to each other, and they may be generated in the data driving controller 270, which is to be described below. Also, the bank input/output lines BIO<0:7> may be the data lines included in the bank region. For example, the bank input/output lines BIO<0:7> may be local input/output lines LIO.

The data driving controller 270 may selectively generate the first data input/output strobe signal STR_DIO and the second data input/output strobe signal STR_DIOB by comparing aligned data ALGN_DAT<0:63> of each of the memory blocks 21, 22, 23, . . . and 28 with the data loaded on data input/output lines DIO<0:63>. Also, the data driving controller 270 may selectively generate the first bank input/output strobe signal STR_BIO and the second bank input/output strobe signal STR_BIOB by comparing aligned data ALGN_DAT<0:63> of each of the memory blocks 21, 22, 23, . . . , and 28 with the data loaded on data input/output lines DIO<0:63>.

Herein, when the write operation is performed consecutively, the data loaded on the data input/output lines 010<0:

63> may be the data that are written during the previous write operation, and the aligned data ALGN_DAT<0:63> may be the data that are written during the current write operation.

In other words, the data driving controller 270 may generate the first data input/output strobe signal STR_DIO and the first bank input/output strobe signal STR_BIO or generate the second data input/output strobe signal STR_DIOB and the second bank input/output strobe signal STR_BIOB according to the change of the logic values of the data. That is, the data driving controller 270 may generate the first data input/output strobe signal STR_DIO and the first bank input/output strobe signal STR_BIO or generate the second data input/output strobe signal STR_DIOB and the second bank input/output strobe signal STR_BIOB according to the number of lines where toggling occurs, by comparing the data that are written during the previous write operation, which is a first write operation, with the data that are written during the current write operation, which is a second write operation.

Therefore, under the control of the data driving controller 270, the first driver 240 may drive the first data input/output driving unit 241 or the second data input/output driving unit 242, and the second driver 250 may drive the first write driving unit 251 or the second write driving unit 252.

The data loaded on the bank input/output lines BIO<0:7> may be transferred to the memory cell array 260.

Meanwhile, although not illustrated in the drawing, in order to store the data loaded on the bank input/output lines BIO<0:7> in the memory cell array 260, the write operation may be performed through diverse well-known constituent elements, such as a column selection circuit and a bit-line sense amplifier.

Figure 3:
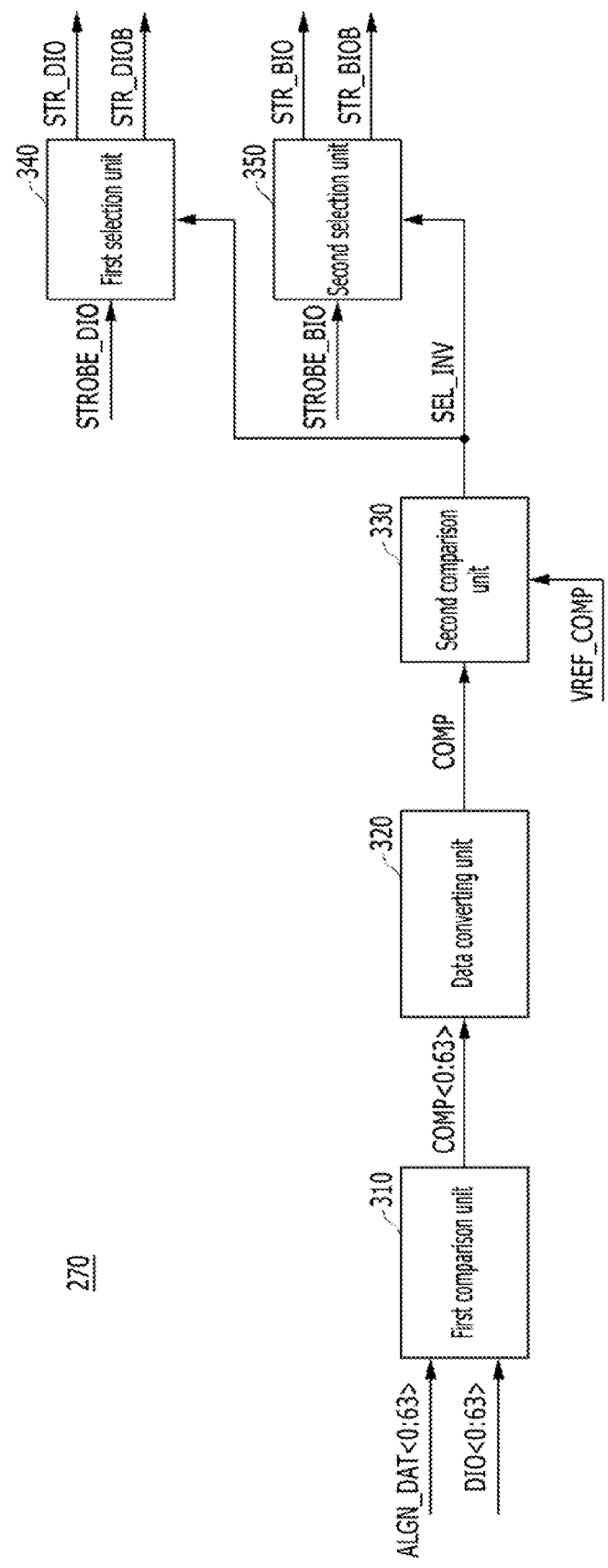
FIG. 3 is a block diagram illustrating an example of a data driving controller employed in the semiconductor memory device of FIG. 2.

FIG. 3 is a block diagram illustrating an example configuration of the data driving controller 270 shown in FIG. 2.

Referring to FIG. 3, the data driving controller 270 may include a first comparison unit 310, a data converting unit 320, a second comparison unit 330, a first selection unit 340, and a second selection unit 350.

The first comparison unit 310 may generate a plurality of comparison signals COMP<0:63> by comparing a plurality of aligned data ALGN_DAT<0:63> that are generated through the memory blocks 21, 22, 23, . . . and 28 with the data loaded on the data input/output lines DIO<0:63>.

Herein, when the write operation is performed consecutively, the data loaded on the data input/output lines DIO<0:63> may be the data that are written during the previous write operation, which is the first write operation, and the aligned data ALGN_DAT<0:63> may be the new write data that are written during the current write operation, which is the second write operation.

The first comparison unit 310 may include an XOR gate. The first comparison unit 310 may compare the data that are written in the data input/output lines DIO<0:63> during the first write operation with the aligned data ALGN_DAT<0:63> that are inputted during the second write operation. When the two data are the same, the first comparison unit 310 may output a value of '0'. When the two data are different, the first comparison unit 310 may output a value of '1'. For example, when it is assumed that the data that are written in the data input/output lines DIO<0:63> have the values of '00000011 . . . ' and the aligned data ALGN_DAT<0:63> which are new write data, have the values of '11111110 . . . ', the comparison signals COMP<0.63> generated in the first comparison unit 310 may have the values of '11111101'.

The data converting unit 320 may convert the comparison signals COMP<0:63> having digital values into analog signals and output an analog comparison signal COMP. The data converting unit 320 may be a digital-to-analog converter DAC.

The second comparison unit 330 may compare the analog comparison signal COMP with a reference comparison signal VREF_COMP and generate a selection control signal SEL_INV for controlling the first selection unit 340 and the second selection unit 350. The second comparison unit 330 may include a comparator, and compare the analog comparison signal COMP with the reference comparison signal VREF_COMP. When the analog comparison signal COMP is smaller than the reference comparison signal VREF_COMP the selection control signal SEL_INV may be of a high logic level. When the analog comparison signal COMP is greater than the reference comparison signal VREF_COMP, the selection control signal SEL_INV may be of a low logic level.

Herein, when the analog comparison signal COMP is smaller than the reference comparison signal VREF_COMP, it means that the number of different bits is small when the data loaded on the data input/output lines DIO<0:63>, which are the previous data, are compared with the aligned data ALGN_DAT<0:63> which are the new data. When the analog comparison signal COMP is greater than the reference comparison signal VREF_COMP it means that there are many different bits when the values of the previous data are compared with the values of the new data.

The first selection unit 340 may selectively output an external data input/output strobe signal STROBE_DIO as the first data input/output strobe signal STR_DIO or the second data input/output strobe signal STR_DIOB in response to the selection control signal SEL_INV.

When the selection control signal SEL_INV is of a high logic level, the first selection unit 340 may output the first data input/output strobe signal STR_DIO. When the selection control signal SEL_INV is of a low logic level, the first selection unit 340 may output the second data input/output strobe signal STR_DIOB.

Herein, the first data input/output strobe signal STR_DIO may have the same phase as the phase of the external data input/output strobe signal STROBE_DIO and the second bank input/output strobe signal STR_BIOB may have the opposite phase to the phase of the external data input/output strobe signal STROBE_DIO. In short, the phases of the first data input/output strobe signal STR_DIO and the second data input/output strobe signal STR_DIOB may be opposite to each other.

The second selection unit 350 may selectively output an external bank input/output strobe signal STROBE_BIO as the first bank input/output strobe signal STR_BIO or the second bank input/output strobe signal STR_BIOB in response to the selection control signal SEL_INV.

When the selection control signal SEL_INV is of a high logic level, the second selection unit 350 may output the first bank input/output strobe signal STR_BIO. When the selection control signal SEL_INV is of a low logic level, the second selection unit 350 may output the second bank input/output strobe signal STR_BIOB.

Herein, the first bank input/output strobe signal STR_BIO may have the same phase as the phase of the external bank input/output strobe signal STROBE_BIO, and the second bank input/output strobe signal STR_BIOB may have the opposite phase to the phase of the external bank input/output strobe signal STROBE_BIO. In short, the phases of the first bank input/output strobe signal STR_BIO and the second bank input/output strobe signal STR_BIOB may be opposite to each other.

Hereafter, the operation of the semiconductor memory device in accordance with an embodiment of the present invention is described by referring to FIGS. 2 and 3.

When the semiconductor memory device performs a write operation, the memory blocks 21, 22, 23 and 28 may serially receive data (e.g., eight data B<0:7>) through data pads (e.g., eight data pads DQ<0:7>). Therefore, since the semiconductor memory device receives eight data B<0:7> through each of the eight data pads DQ<0:7>, the number of the data that the semiconductor memory device receives comes to 64 (64=8×8).

The data aligner 230 may align input data DINB<0:7> that are serially inputted based on internal strobe signals IDQS and IDQSB, which are generated by performing a frequency division on a data strobe signal DQS, into parallel data and generate aligned data ALGN_DAT<0:63>.

The aligned data ALGN_DAT<0:63> that are aligned in parallel to each other may be driven to data input/output lines DIO<0:63> by the first driver 240. The data loaded on the data input/output lines DIO<0:63> may be driven to the bank input/output lines 810<0:63> by the second driver 250.

Herein, the first driver 240 may selectively drive the first data input/output driving unit 241 or the second data input/output driving unit 242 based on the first data input/output strobe signal STR_DIO and the second data input/output strobe signal STR_DIOB. The second driver 250 may selectively drive the first write driving unit 251 or the second write driving unit 252 based on the first bank input/output strobe signal STR_BIO and the second bank input/output strobe signal STR_BIOB.

The first and second data input/output strobe signals STR_DIO and STR_DIOB and the first and second bank input/output strobe signals STR_BIO and STR_BIOB may be selectively generated by comparing the previous data that are written during the first write operation, which are the data loaded on the data input/output lines DIO<0:63>, with the new data that are inputted during the second write operation which are the aligned data ALGN_DAT<0:63>, when the write operation is performed consecutively.

When the number of different values between the data loaded on the data input/output lines DIO<0:63> and the aligned data ALGN_DAT<0:63> is small, the first data input/output strobe signal STR_DIO and the first bank input/output strobe signal STR_BIO may be generated.

Therefore, the first driver 240 may drive the first data input/output driving unit 241 for driving the aligned data ALGN_DAT<0:63> into the data input/output lines DIO<0:63>. Also, the second driver 250 may drive the first write driving unit 251 for driving the data loaded on the data input/output lines DIO<0:63> into the bank input/output lines BIO<0:63>.

On the other hand, when there are many different values between the data loaded on the data input/output lines DIO<0:63> and the aligned data ALGN_DAT<0:63>, the second data input/output strobe signal STR_DIOB and the second bank input/output strobe signal STR_BIOB may be generated.

Therefore, the first driver 240 may drive the second data input/output driving unit 242 for driving inverted data of the aligned data ALGN_DAT<0:63> into the data input/output lines DIO<0:63>, and the second driver 250 may drive the second write driving unit 252 for driving inverted data of the data loaded on the data input/output lines DIO<0:63> into the bank input/output lines BIO<0:63>.

Hence, according to an embodiment of the present invention, the comparison of the previous data with the new data finds that there are preset threshold value different logic values between them, the new data are inverted and the inverted data of the new data are driven to the data input/output lines DIO<0:63> and the bank input/output lines BIO<0:63>. In this way, the amount of current consumed in the data transfer lines during the write operation may be reduced.

According to an embodiment of the present invention, a semiconductor memory device is provided having reduced operation current consumption by minimizing the toggling of a data transfer line during a data write operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a memory cell array;
   a data receiver suitable for receiving a plurality of data sequentially inputted from an exterior, the plurality of data including previous data and current data;
   a data driving controller suitable for detecting the number of toggling values of the current data in comparison with the previous data and generating first to fourth driving control signals based on the number of toggling values; and
   a driver suitable for receiving input data through the data receiver and driving the input data or inverted input data to data transfer lines in response to the first to fourth driving control signals.

2. The semiconductor memory device of claim 1, wherein the data driving controller includes:
   a first comparison unit suitable for generating a comparison signal by comparing the previous data with the current data;
   a second comparison unit suitable for generating a selection control signal by comparing the comparison signal with a reference comparison signal;
   a first selection unit suitable for selectively outputting the first driving control signal or the second driving control signal in response to the selection control signal; and
   a second selection unit suitable for selectively outputting the third driving control signal or the fourth driving control signal in response to the selection control signal.

3. The semiconductor memory device of claim 1, wherein the data receiver includes:
   a data buffer suitable for receiving external data in response to a reference voltage; and
   an internal strobe signal generator suitable for generating an internal data strobe signal by performing a frequency division on a data strobe signal.

4. The semiconductor memory device of claim 3, wherein the data receiver further includes:
   a data aligner suitable for aligning internal data inputted through the data buffer in response to the internal data strobe signal and for generating the aligned data as the input data.

5. The semiconductor memory device of claim 3, wherein the data driving controller generates the first to fourth driving control signals, which are inverted data and non-inverted data of the input data, based on the number of values of the aligned data outputted from the data aligner that toggle.

6. The semiconductor memory device of claim 3, wherein the driver includes:
- a first driving unit suitable for driving the aligned data to a first data transfer line among the data transfer lines in response to the first driving control signal or the second driving control signal; and
- a second driving unit suitable for driving the aligned data loaded on the first data transfer line to a second data transfer line among the data transfer lines in response to the third driving control signal or the fourth driving control signal.

7. The semiconductor memory device of claim 6, wherein the first driving unit includes:
- a first data input/output driving unit suitable for driving the aligned data to the first data transfer line in response to the first driving control signal; and
- a second data input/output driving unit suitable for driving the aligned data to the first data transfer line in response to the second driving control signal, and
- wherein the first data input/output driving unit and the second data input/output driving unit are driven selectively, and output values of the first data input/output driving unit and the second data input/output driving unit are differential output values.

8. The semiconductor memory device of claim 6, wherein the second driving unit includes:
- a first write driving unit suitable for driving the data loaded on the first data transfer line to the second data transfer line in response to the third driving control signal; and
- a second write driving unit suitable for driving the data loaded on the first data transfer line to the second data transfer line in response to the fourth driving control signal, and
- wherein the first write driving unit and the second write driving unit are driven selectively, and output values of the first write driving unit and the second write driving unit are differential output values.

9. The semiconductor memory device of claim 6, wherein the previous data include the data loaded on the first data transfer line during a first write operation.

10. The semiconductor memory device of claim 9, wherein the current data include the input data that are inputted during a second write operation which is performed after the first write operation.

11. The semiconductor memory device of claim 6, wherein the first data transfer line includes a global input/output line, and the second data transfer line includes a local input/output line.

12. A method for operating a semiconductor memory device, comprising:
- sequentially receiving a plurality of data through a data pad;
- detecting the number of toggling values of current data by comparing the current data with previous data;
- generating a plurality of driving control signals based on the detected number of the toggling values of the current data;
- converting the detected number of the toggling values of the current data into a toggling voltage;
- driving input data to data transfer lines, when the toggling voltage is lower than a reference voltage; and
- inverting the input data and driving the inverted data to the data transfer lines, when the toggling voltage is higher than the reference voltage.

13. The method of claim 12, wherein the generating of the plurality of the driving control signals includes:
- generating first and third driving control signals among the plurality of the driving control signals, when the toggling voltage is lower than the reference voltage; and
- generating second and fourth driving control signals among the plurality of the driving control signals, when the toggling voltage is higher than the reference voltage.

14. The method of claim 13, further comprising:
- generating an internal data strobe signal by performing a frequency division on a data strobe signal; and
- generating aligned data that are obtained by aligning the received plurality of data as the input data in response to the internal data strobe signal.

15. The method of claim 14, wherein the generating of the plurality of the driving control signals includes:
- generating the plurality of the driving control signals, which are inverted data and non-inverted data of the plurality of the data, based on the number of toggling values of the aligned data.

16. The method of claim 14, wherein the driving of the input data to the data transfer lines includes:
- driving the aligned data to a first data transfer line among the data transfer lines in response to the first driving control signal; and
- driving the aligned data loaded on the first data transfer line to a second data transfer line among the data transfer lines.

17. The method of claim 16, wherein the inverting of the input data and driving the inverted data to the data transfer lines includes:
- inverting the aligned data so and driving the inverted aligned data to the first data transfer line in response to the second driving control signal; and
- inverting the inverted aligned data loaded on the first data transfer line and driving resultant data to the second data transfer line.

18. The method of claim 16, wherein the previous data include data that are loaded on the first data transfer line during a first write operation.

19. The method of claim 18, wherein the current data include the input data that are inputted during a second write operation which is performed after the first write operation.

* * * * *